United States Patent [19]

Noguchi et al.

[11] Patent Number: 4,476,478

[45] Date of Patent: Oct. 9, 1984

[54] SEMICONDUCTOR READ ONLY MEMORY AND METHOD OF MAKING THE SAME

[75] Inventors: Hideo Noguchi, Yokohama; Tugunari Iwamoto, Tokyo; Sakae Takei, Ebina, all of Japan

[73] Assignee: Tokyo Shibaura Denki Kabushiki Kaisha, Kawasaki, Japan

[21] Appl. No.: 245,544

[22] Filed: Mar. 19, 1981

[30] Foreign Application Priority Data

Apr. 24, 1980 [JP] Japan ............................... 55-054552
May 6, 1980 [JP] Japan ............................... 55-59708

[51] Int. Cl.³ .................. H01L 29/78; H01L 27/02; H01L 29/04
[52] U.S. Cl. ........................................ 357/41; 357/51; 357/59; 357/91; 357/23.1
[58] Field of Search ................ 357/24, 59, 41, 51, 357/91, 23 R

[56] References Cited

U.S. PATENT DOCUMENTS

| | | | |
|---|---|---|---|
| 3,699,646 | 10/1972 | Vadasz | 357/59 |
| 3,735,358 | 5/1973 | Ho | 307/279 X |
| 3,792,319 | 2/1974 | Tsang | 357/59 |
| 4,139,786 | 2/1979 | Raymond, Jr. et al. | 357/41 |
| 4,146,902 | 3/1979 | Tanimoto et al. | 357/59 |
| 4,176,442 | 12/1979 | Bischoff et al. | 357/41 X |
| 4,198,246 | 4/1980 | Wu | 357/91 |
| 4,214,918 | 7/1980 | Gat et al. | 357/91 |
| 4,228,450 | 10/1980 | Anantha et al. | 357/34 X |
| 4,238,839 | 12/1980 | Redfern et al. | 357/41 X |
| 4,240,843 | 12/1980 | Celler et al. | 357/41 X |
| 4,305,200 | 12/1981 | Fu et al. | 357/41 X |

OTHER PUBLICATIONS

P. W. Cook et al., "Read-only memory fabrication by laser formed connections", *IBM Technical Disclosure Bulletin*, vol. 15 (1973), pp. 2371-2372.

T. R. Mayhew et al., "P-MOS technology for quick turnaround custom LSI", *RCA Engineer*, (1972).

Primary Examiner—Andrew J. James
Assistant Examiner—J. Carroll
Attorney, Agent, or Firm—Cushman, Darby & Cushman

[57] ABSTRACT

A semiconductor read only memory having a plurality of MOS transistors and polycrystalline or amorphous silicon resistances connected to the source or drain regions of the MOS transistors, laser beams irradiating selected silicon resistances to thermally activate those resistances and store the required data.

5 Claims, 13 Drawing Figures

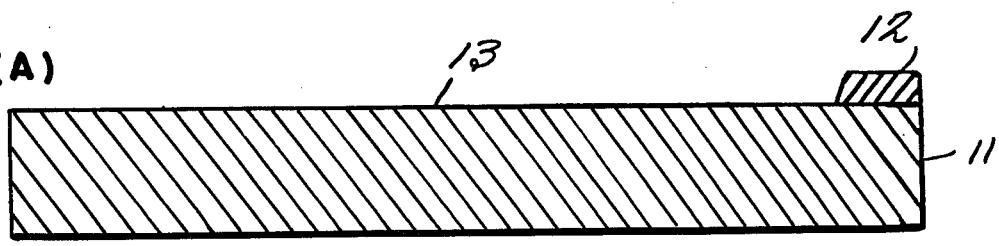
FIG. I(A)
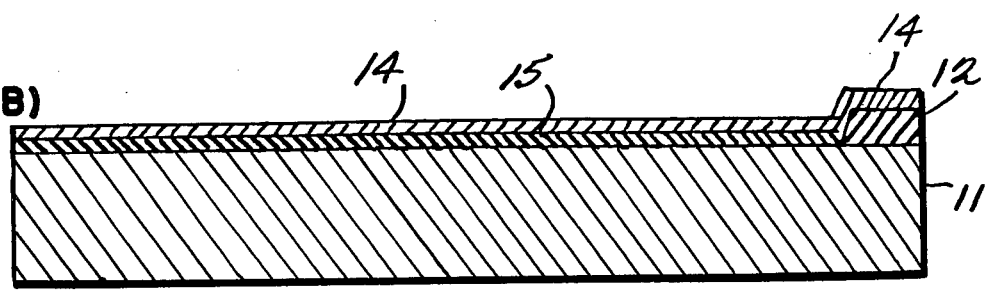
FIG. I(B)
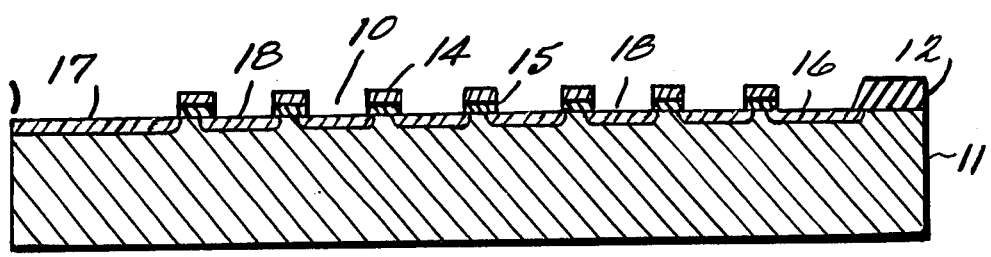
FIG. I(C)
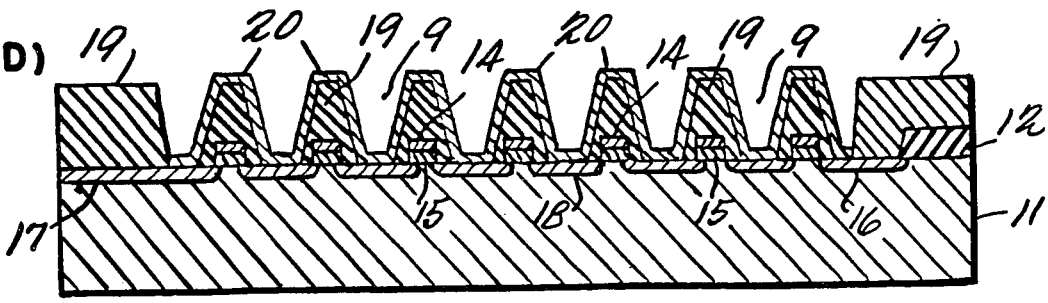
FIG. I(D)
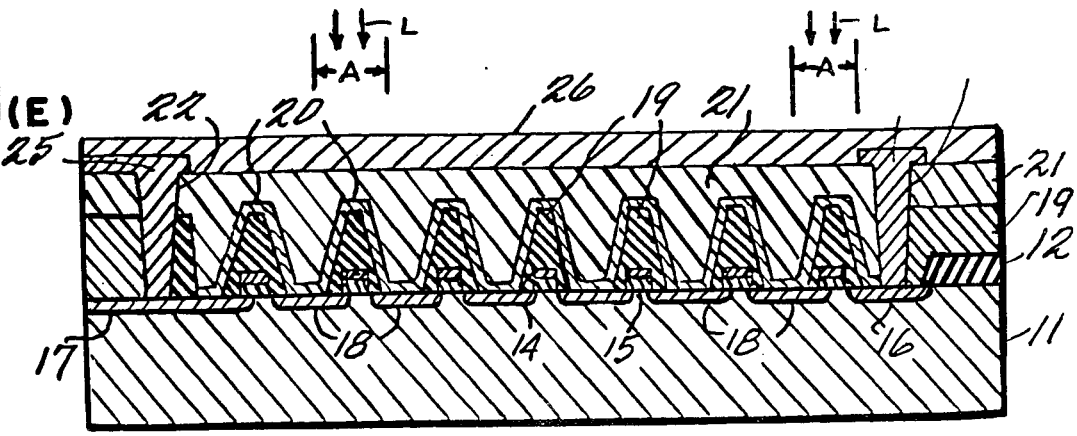
FIG. I(E)

SEMICONDUCTOR READ ONLY MEMORY AND METHOD OF MAKING THE SAME

BACKGROUND OF THE INVENTION

This invention relates to a semiconductor read only memory (ROM) which can be more efficiently manufactured than conventional memories with higher productivity.

A conventional mask ROM (read only memory) is manufactured by the use of photo masks on which patterns are written corresponding to the desired data to be stored in the memory cells. First, the user presents a desired specification to the maker. The maker must then produce the logical design and pattern design, manufacture the mask and make the wafer later on the user's request. The maker could not start to manufacture the ROM until the specification of the user was finished.

OBJECT AND SUMMARY OF THE INVENTION

An object of this invention is to provide an improved semiconductor read only memory which can be more efficiently produce.

The semiconductor read only memory according to this invention includes a plurality of MOS transistors formed on a substrate and silicon resistances of polycrystal or amorphous connected to the source region and the drain region of the MOS transistors. The partially completed ROM can then be stored as stock. Whenever desired the resistances can be selectively activated by laser annealing or otherwise to a low resistance responding to the desired data.

BRIEF DESCRIPTION OF THE DRAWINGS

This and other objects and advantages of the invention will become more apparent and more readily appreciated from the following detailed description of the presently referenced exemplary embodiment of the invention taken in conjunction with the accompanying drawings, of which:

FIGS. 1(A) to (E) are sectional views illustrating steps of an embodiment of this invention;

DETAILED DESCRIPTION OF THE PREFERRED EMBODIMENTS

Figure 2:
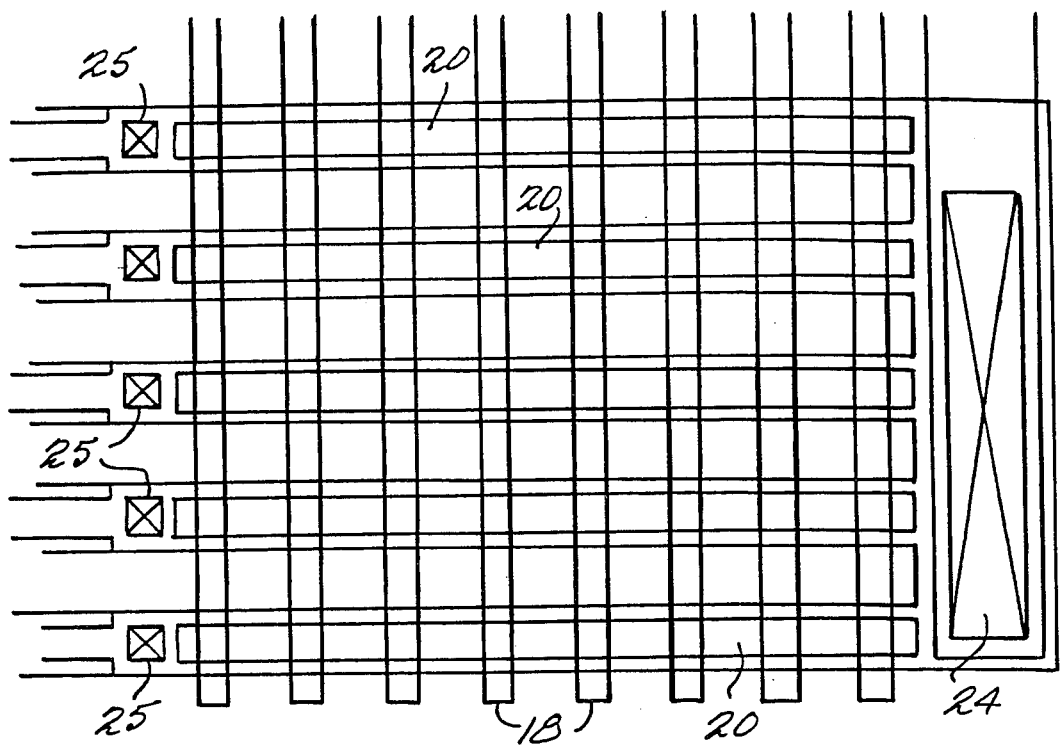
FIG. 2 is a plan view of a device of FIG. 1.

Polycrystalline or amorphous silicon film used widely as the electrodes and the interconnections of semiconductor devices maintains its high resistance or nonconductivity when implanted with impurity ions. Thermal activation is required to put the film to practical use. The resistance of polycrystalline or amorphous silicon film with or without impurities is conventionally decreased by enlarging the grain size with laser annealing, and is then used as electrodes and interconnections.

This invention is based on the above-mentioned characteristic of polycrystalline or amorphous silicon. Referring now to FIGS. 1(A) to (D), there are shown schematic views of the invention. P-type semiconductor substrate 11 is thermally oxidized in a steam atmosphere at 1000° C. and a field oxide film 12 is formed on the surface of substrate 11. Thereafter an active area 13 is produced by photoengraving (FIG. 1(A)). Substrate 11 is thermally oxidized again in an oxygen atmosphere at 1000° C. including 3% hydrogen chloride, and an oxide film 15 of 700 to 900 Angstroms thickness is formed on the exposed surface. Polycrystalline or amorphous silicon film 14 of 3500 Angstroms thickness is formed on the surface of oxide film 15 and 12 using the chemical vapor deposition (CVD) method, and silicon film 14 is activated in an oxyphosphorus chloride atmosphere at 1000° C. serving as diffusion sources (FIG. 1(B)).

Thereafter, silicon film 14 is patterned by photoengraving and gate electrodes and interconnections are formed. The exposed oxide films are etched using the gate electrodes and interconnections as masks, and gate electrodes 14, gate oxides 15 and windows 10 are formed. Source regions 16, drain regions 17 and connecting regions 18 are formed by ion implantation of arsenic through windows 10. A plurality of MOS transistors are serially connected with connecting regions 18 used commonly as source and drain regions of neighboring transistors (FIG. 1(C)). CVD-oxide film 19 of 7000 Angstroms thickness is formed as a protecting film on the surface of substrate 11, and source, drain and connecting regions are activated in a nitrogen atmosphere at 1000° C. Contact holes 9 are opened by selective etching and polycrystalline or amorphous silicon film 20 of 3500 Angstroms thickness is formed by the CVD method, then arsenic is diffused into silicon film 20 by ion implantation, and silicon film 20 is changed to a silicon resistance film. In this condition, silicon resistance film 20 is in nonconductive of high resistance (FIG. 1(D)).

Thereafter, a protecting insulator film 21 of phosphosilicate glass of 7000 Angstroms thickness is covered on the surface of substrate 11, and contacting holes 22 and 23 are opened through protecting insulator film 21 and CVD-oxide film 19. As a result of it, source region 16 and drain region 17 being exposed.

Aluminum is evaporated on the surface of substrate 11, and source electrode 24 and drain electrode 25 are formed by selective photoengraving. Thereafter a passivating film 26 of phosphosilicate glass is covered on the surface of substrate 11. In above-mentioned steps, each source and drain region of MOS transistors have been connected by polycrystalline or amorphous silicon resistances. Thus, the equivalent circuit shown in FIG. 3 (aftermentioned in detail) has been provided as half finished goods which can be stored. However, the silicon resistances are nonconductive of high resistant yet. Laser beams L are selectively irradiated (shown by arrows A) on the surface upon the desired silicon resistances to store the data responding to the specifications of the user after sintering at 450° C. in a nitrogen atmosphere including 10% hydrogen (FIG. 1(E)). FIG. 2 illustrates a plan view of the NAND type ROM formed in a matrix, similar elements being assigned the same reference numbers as in FIG. 1. Laser beam irradiation is satisfactory to partially irradiate the predetermined silicon resistances by computer control and also using the hard mask to expose desired portions.

Figure 3:
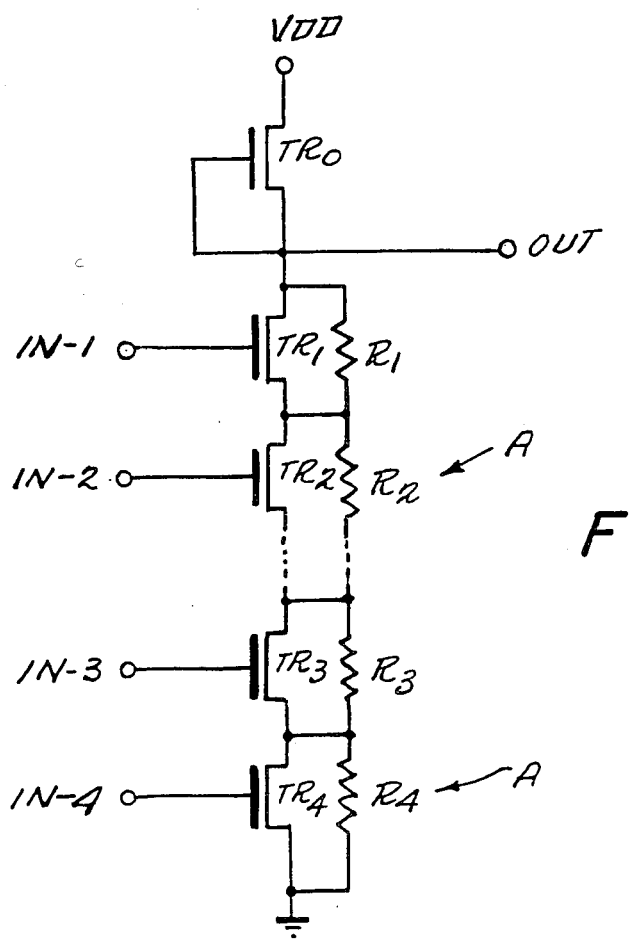
FIG. 3 is an equivalent circuit diagram of a device of FIG. 1.

In this embodiment of the invention, referring to FIG. 3, resistances R2 and R4 (shown by arrows A) are activated by laser beams so the values of resistances R2 and R4 are decreased. Thus, MOS transistors TR2 and TR4 do not operate normally as enhance mode transistors because of the short between source and drain electrodes of these transistors by activated resistances R2 and R4. However, other transistors TR1 and TR3 operate normally as original enhance mode transistors with high nonactivated resistances R1 and R3.

In this result, if transistor TR2 is selected, by the input of transistor TR2 is low and the inputs of another transistor are high, transistors TR1 and TR3 operate and transistor TR4 is equivalent to the resistance, so the output level is low level which is the selective level of transistor TR2. Thus a NAND type mask ROM integrated circuit is provided.

The ROM of the present invention is manufactured by laser annealing at the final step in the flow of wafer fabrication so half finished goods having nonactivated resistances can be stocked when the specifications of users are not yet determined. A complete data stored ROM is manufactured by partial activation of predetermined regions responding to the specifications of users. Thus, the term between the order and the delivery of goods can be shortened and productivity remarkably improved.

This invention applied to other ROMS as will be explained by FIGS. 4 to 6. Since the following steps are almost the same as the above-mentioned explanation, details are omitted here. FIGS. 4(A) to (D) illustrate a flow of the fabrication of a NOR type mask ROM of the invention.

After a field oxide film 42 is formed on the surface of semiconductor substrate 41, active area 43 is formed by photoengraving (FIG. 4(A)). Thereafter MOS transistors having gate electrodes 44, gate oxide films 45, source regions 46 and drain regions 47 and simultaneously connecting regions 48 are formed (FIG. 4(B)).

Polycrystalline or amorphous silicon resistances 50 are connected between source regions 46 and connecting regions 48 through CVD oxide films 49, but at this time these resistances 50 are nonconductive or high resistant (FIG. 4(C)). Drain electrode 52 is connected to drain region 47 through glass film 51 and passivation film 53 is formed over all of the surface of the substrate. Desired portions A are activated by irradiation of laser beam L.

Figure 4:
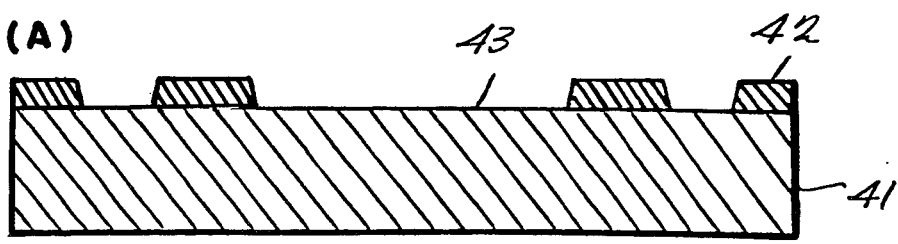
FIGS. 4(A) to (D) are sectional views, similar to FIG. 1, of an alternate embodiment of this invention.
Figure 4:
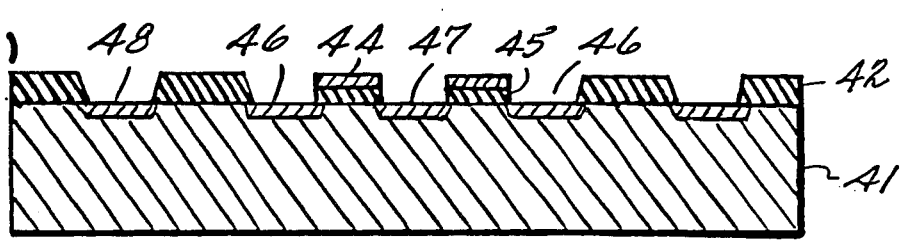
Figure 4:
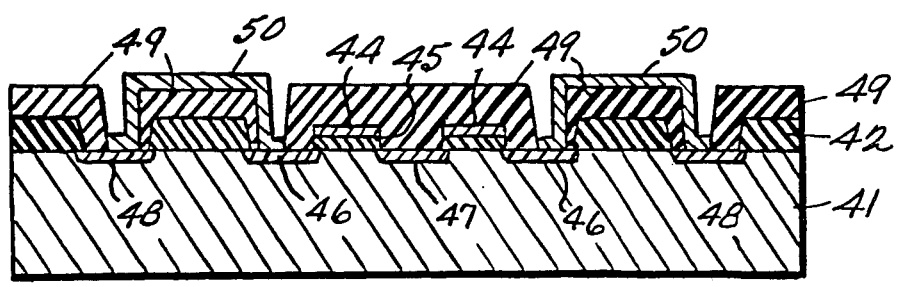
Figure 4:
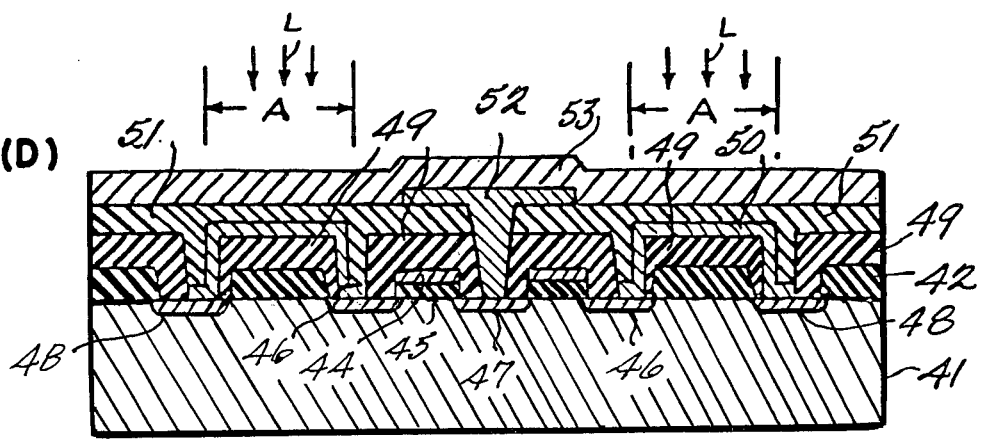
Figure 5:
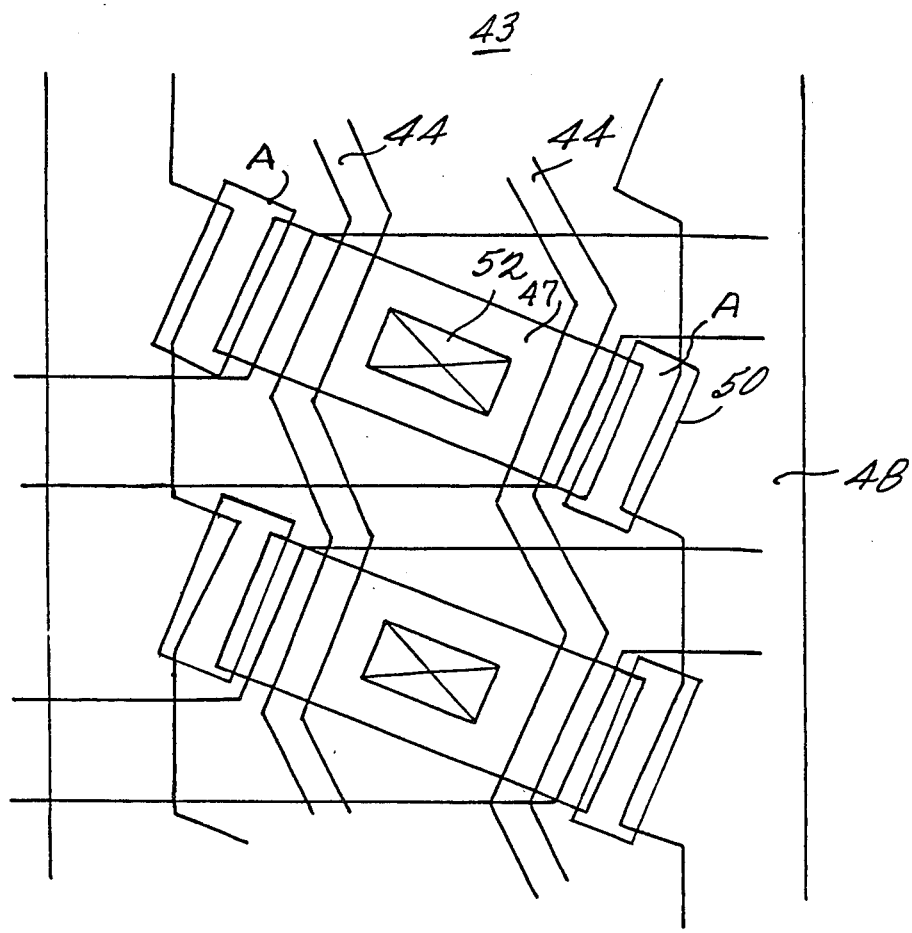
FIG. 5 is a plan view, similar to FIG. 2, of a device of FIG. 4.
Figure 6:
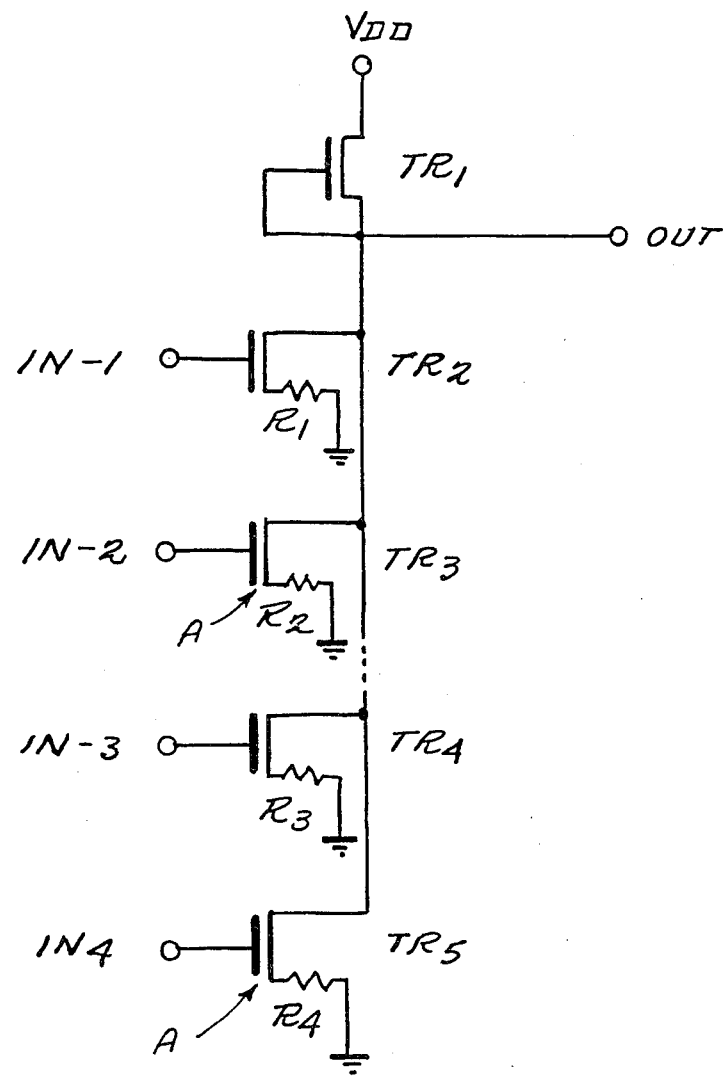
FIG. 6 is an equivalent circuit diagram, similar to FIG. 3, of a device of FIG. 4.

FIG. 5 illustrates a plan view of FIG. 4, and similar elements are assigned the same reference number as in FIG. 4. FIG. 6 illustrates an equivalent circuit of the device shown in FIG. 4, resistances R2 and R4 shown by arrows A being activated by laser beams. Transistors TR3 and TR5 can be operated in the enhance mode, but transistors TR2 and TR4 cannot operate normally. In this result, if transistor TR2 is selected, the output level is a high level, but if transistor TR3 is selected, the output level is a low level. Thus, a NOR type mask ROM is provided.

In this embodiment, the silicon resistances have been connected only to source regions, but it is also possible that the other silicon resistances can be connected to drain regions.

In these embodiments of the invention, the desired ROM can be completed merely by activating predetermined portions responding to the specification of the user, so the productivity of ROM has remarkably improved.

Many changes and modifications in the above-described embodiment of the invention can be carried out without departing from the scope thereof. Accordingly that scope is limited only by the scope of the appended claims.

What is claimed is:

1. A semiconductor read only memory comprising:
   (a) a semiconductor substrate of a first conductivity type;
   (b) a plurality of regions of a second conductivity type, opposite to said first conductivity type formed in the semiconductor substrate;
   (c) a plurality of gate electrodes bridging two adjacent second conductivity type regions through insulating layers, said second conductivity type regions, gate electrodes and insulating layers forming series connected MOS transistors; and
   (d) silicon resistances connected between adjacent second conductivity type regions through an insulating layer and each being positioned over a gate electrode of a MOS transistor,
   (e) a passivation film formed over all the semiconductor substrate, and wherein said silicon resistances being selectively activatable by laser beam irradiation so as to decrease the resistance thereof.

2. A semiconductor read only memory as in claim 1, wherein said silicon resistances are polycrystalline or amorphous.

3. A semiconductor read only memory comprising:
   (a) a semiconductor substrate of a first conductivity type;
   (b) first to fifth regions of a second conductivity type opposite to said first conductivity type formed in the semiconductor substrate;
   (c) a first gate electrode bridging the first and second regions of said second conductivity type through an insulating layer, said first gate electrode, first and second regions and the insulating layer forming a first MOS transistor;
   (d) a second gate electrode bridging the second and third regions of said second conductivity type through an insulating layer, said second gate electrode, second and third regions and insulating layer forming a second MOS transistor;
   (e) a first silicon resistance connected between the first and fourth regions of second conductivity type through and insulating layer; and
   (f) a second silicon resistance connected between the third and fifth regions of said second conductivity type through an insulating layer,
   (g) a passivation film formed over all of the semiconductor substrate, and wherein said first and second silicon resistances being selectively activatable by laser beam irradiation so as to decrease the resistance thereof.

4. A semiconductor read only memory according to claim 1 or 3 wherein said silicon resistances are polycrystalline.

5. A semiconductor read only memory according to claim 1 or 3 wherein said silicon resistances are amorphous.

* * * * *